United States Patent
Busch et al.

[11] 3,941,925
[45] Mar. 2, 1976

[54] DIGITAL SOFT EDGE VIDEO TRANSITION SYSTEM

[75] Inventors: Albert E. Busch; John R. Hotsenpiller, both of Bloomington, Ind.

[73] Assignee: Sarkes Tarzian, Inc., Bloomington, Ind.

[22] Filed: Mar. 10, 1975

[21] Appl. No.: 557,067

[52] U.S. Cl. ............................. 178/6.8; 178/DIG. 6
[51] Int. Cl.² ......................................... H04N 5/22
[58] Field of Search .............. 178/DIG. 6, 6.8, 5.8 R

[56] References Cited
UNITED STATES PATENTS

| | | | |
|---|---|---|---|
| 3,627,914 | 12/1971 | Davies | 178/5.8 R |
| 3,783,188 | 1/1974 | Hurford | 178/6.8 |
| 3,792,463 | 2/1974 | Eriksson | 178/DIG. 6 |

*Primary Examiner*—Howard W. Britton
*Attorney, Agent, or Firm*—Mason, Kolehmainen, Rathburn & Wyss

[57] ABSTRACT

A digital soft edge transition system for use in a video special effects generator utilizes digital circuitry responsive to a transition signal for switching either a first video input signal or a second video input signal into a composite video output signal. An analog video switch is utilized to provide a gradual transition between the video input signals. The gradient of the transition is determined by a counter and a variable speed clock, driving a digital-to-analog converter, or by a data selector interposed between the counter and the digital-to-analog converter. A "mirror image" circuit is utilized to generate symmetrical effects such as circles, diamonds and other effects requiring more than one transition between the video input signals. The "mirror image" circuit serves to store the location of the completion of the first transition and to begin the second transition at a location on the displayed image determined by the value of the stored location. In the preferred embodiment, the locations of the completion of the first transition and the beginning of the second transition are symmetrically disposed about a center line of the displayed image so that the desired effect is symmetrically displayed on the viewing screen.

24 Claims, 4 Drawing Figures

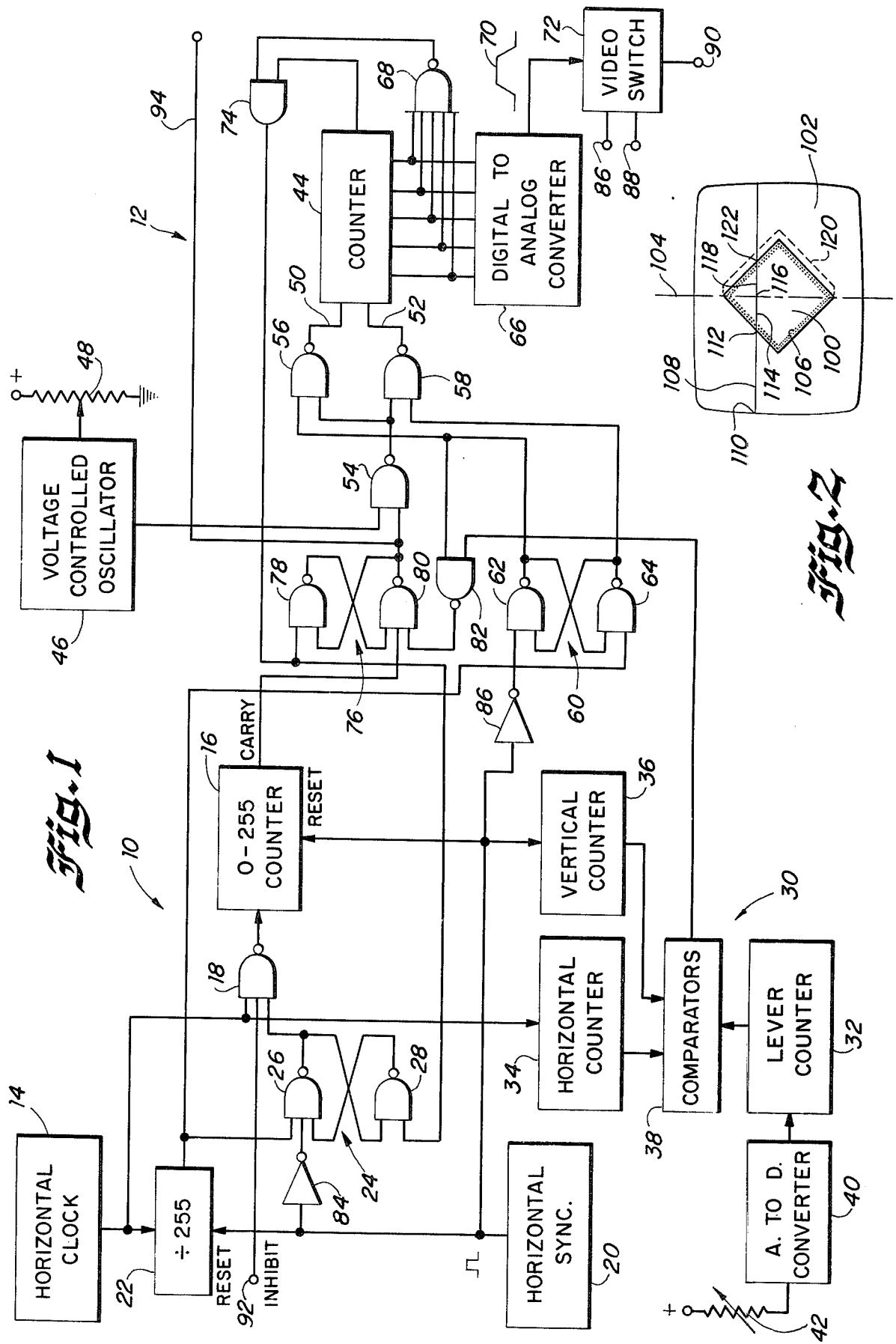

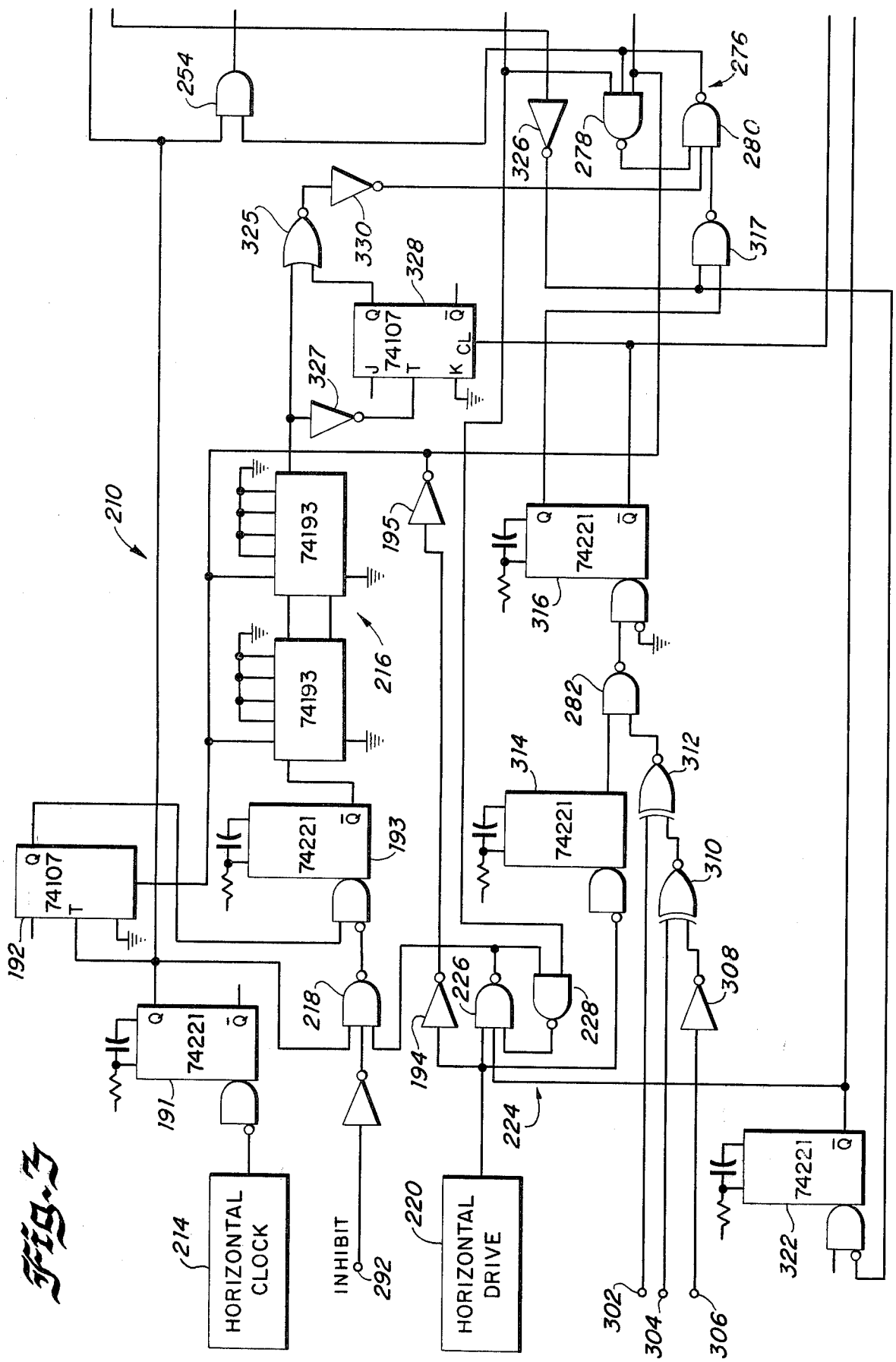

DIGITAL SOFT EDGE VIDEO TRANSITION SYSTEM

BACKGROUND OF THE INVENTION

The present invention relates generally to video special effects generators for combining multiple video input signals into a single video output signal, and more particularly, to a special effects generator utilizing digital circuitry for providing a gradual transition between two video input signal switched into the video output signal.

Digital special effects generators are known. One such digital special effects generator is described in U.S. Pat. No. 3,821,468 issued June 28, 1974 to Albert E. Busch, assigned to the same assignee as the assignee of the present invention and incorporated herein by reference. While digital special effects generators such as the one described in the above-mentioned Busch reference provide a variety of special effects, transitions in the video output signal between two video input signals are abrupt, thereby resulting in a video display wherein the two video signals are displayed adjacent to each other with a sharp line separating the two displayed images. Such sharp transitions are desirable for many special effects; however, for other special effects such as vignette-type inserts, it is desirable to have a gradual transition between the two video signals to provide a soft edge effect in which the two video signals gradually blend into each other when displayed on the screen.

Circuits for providing a gradual transition between video signals have been constructed. Such circuits utilize standard special effects generators that have been modified by adding an analog video switch that gradually increases the amplitude of one of the video signals while simultaneously decreasing the amplitude of the other video signal to provide the soft edge effect. A delay circuit is generally interposed between the analog switch and the circuitry driving it to provide a gradually changing drive signal to the analog video switch.

While this technique provides a way of achieving a gradual transition between two video signals, when a symmetrical effect such as a circle or a diamond effect is selected and a soft edge is desired, the switching delay introduced by the delay circuit driving the analog video switch causes the display of the central image (i.e., the diamond or circle) to shift in the direction of scanning by an amount equal to the width of the transition border. Unless compensated, such a shift can be annoying to the viewer, particularly when a relatively wide transition border is generated.

SUMMARY OF THE INVENTION

Accordingly, it is an object of the present invention to provide a new and improved video special effects generator.

It is another object of the present invention to provide an improved soft edge video transition circuit that overcomes many of the disadvantages of the prior art circuits.

It is yet another object of the present invention to provide a new soft edge video transition circuit that does not offset the central image of a symmetrical effect when a soft edge mode is employed.

Yet another object of the present invention is to provide an improved digital soft edge video transition circuit.

In accordance with a preferred embodiment of the invention, each horizontal scanning line is divided into 512 segments by a clock providing 512 pulses for each scanning line. The output of the clock is counted by an end-of-transition counter. The end-of-transition counter is reset to zero at the beginning of each scanning line and counts the clock pulses until the completion of a first video transition, at which point the counter is stopped. The end-of-transition counter has a capacity of 255 counts which corresponds approximately to one-half of a horizontal scan. A divide-by-255 circuit is driven by the clock and provides an output signal to restart the end-of-transition counter at the midpoint of the scan. The end-of-transition counter counts until it reaches a count of 255 at which point it provides a signal to the video switching circuitry to begin the gradual transition back to the original signal. Because the maximum count in the end-of-transition counter corresponds to one-half of a scanning line, and the count stored in the end-of-transition counter at the end of the first transition represents the portion of the scan beginning with the horizontal synchronizing pulse and ending with the end of the transition border. The number of counts required to fill the counter represents the length of the scan between the end of the transition border and the center of the scan. Consequently, when the end-of-transition counter is driven to overflow after being restarted, the length of scan generated between the center of the scan and counter overflow is equal to the length of the scan between the end of the transition border and the center of the scan. As a result, the transition border is symmetrically disposed about the center of the scan.

The switching waveform for operating the analog video switch is generated by a border counter circuit driving a digital-to-analog converter. To provide a variable width transition border, a voltage controlled oscillator may be utilized to drive the border counter or a data selector may be interposed between the border counter circuit and the digital-to-analog converter. The border counter circuit utilizes an up/down counter that is triggered by a video transition signal and driven in an up counting mode following the receipt of the video transition signal. The output of the border counter is applied to the digital-to-analog converter and causes the digital-to-analog converter to apply a gradual switching waveform to the analog video switch for gradually effecting the transition as the count increases. The transition is completed when the border counter reaches a predetermined count and provides an output signal to freeze the count in the end-of-transition counter until the end-of-transition counter is retriggered at the center of the scan. The amount of time required to complete the transition is determined by the frequency of the voltage controlled oscillator, or by data selectors which may be interposed between the border counter and the digital-to-analog converter.

When the end-of-transition counter is retriggered and overflows after the center of the scan, the direction of count in the border counter is reversed and the output of the digital-to-analog converter decreases, and gradually returns the analog video switch to its initial condition. The width of the border is controlled by adjusting the frequency of the voltage controlled oscillator.

The other objects and advantages of the present invention will be readily apparent from the following detailed description and drawings, wherein:

FIG. 1 is a simplified schematic diagram in digital logic and block diagram form illustrating the operation of a preferred embodiment of the digital soft edge video transition system according to the invention;

FIG. 2 is an illustration of the viewing screen of a television monitor showing one of the soft edge special effects provided by the circuit according to the invention; and FIGS. 3 and 4 are detailed schematic diagrams of a practical embodiment of the digital soft edge transition system according to the invention similar to the system illustrated in simplified form in FIG. 1.

DETAILED DESCRIPTION OF THE INVENTION

Figure 4:
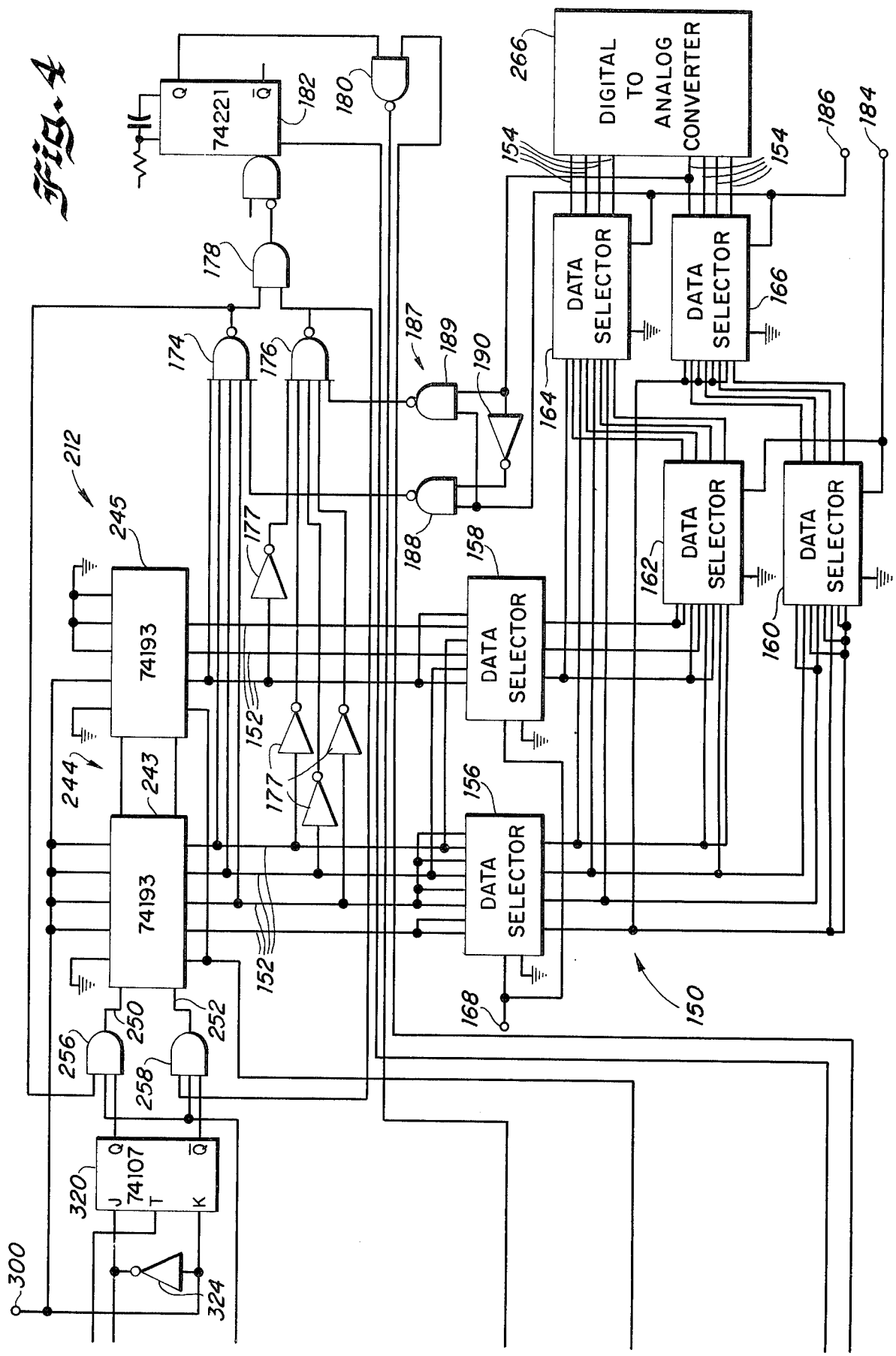

Referring to FIG. 1, the digital soft edge transition circuit according to the invention comprises an end-of-transition locating circuit 10 and a switching waveform generator 12. Only a horizontal end-of-transition locating circuit 10 is shown in FIG. 1; however, a similar circuit may be utilized to provide a soft edge transition in the vertical direction. The end-of-transition locating circuit 10 includes a horizontal clock 14 that generates 512 pulses during each horizontal line scanning interval. The pulses from the horizontal clock 14 are applied to an 8-bit end-of-transition counter 16 by means of a 3-input NAND gate 18. A source of horizontal synchronizing pulses 20 is utilized to reset the counter 16 at the beginning of each horizontal scanning line. A divide-by-255 divider circuit 22 controls a latch 224 comprising a pair of NAND gates 26 and 28. The divide-by-255 circuit 22 counts the pulses from the horizontal clock 14 and provides an output signal indicative of the center of the horizontal scan after 255 pulses have been received.

The soft edge transition circuit is controlled by a digital special effects generator 30. The digital special effects generator 30 is illustrated only in block diagram form for reasons of simplicity, but a much more detailed description of a typical digital special effects generator usable as the generator 30 is given in the referenced Busch U.S. Pat. No. 3,821,468 patent. The digital special effects generator 30 includes a lever counter 32 (similar to the lever counter 400 shown in FIG. 1 of the Busch patent), a horizontal counter 34 (similar to the horizontal counter 600), a vertical counter 36 (similar to the vertical counter 500), a series of comparators 36 (which may include a horizontal comparator such as the comparator 650, a circle comparator such as the comparator 760 and other comparators for providing different effects), an analog-to-digital converter 40 (such as the analog-to-digital converter 300) and a lever controlled potentiometer 42 (similar to the lever controlled potentiometer 101). The function of the special effects generator section 30 is to provide a transition signal for switching the output video signals in accordance with the position of the lever potentiometer 42.

The switching waveform generator 12 includes a counter 44 that is driven by a voltage controlled oscillator 46. The frequency of the voltage controlled oscillator 46 is determined by the setting of a potentiometer 48. The output signal from the voltage controlled oscillator 46 is applied to an up counting input 50 of the counter 44 when a pair of NAND gates 54 and 56 are enabled, or to a down counting input 52 when the NAND gate 54 and a NAND gate 58 are enabled. A latch circuit 60 comprising a pair of NAND gates 62 and 64 is controlled by the horizontal synchronizing circuit 20 and the divider circuit 22 and determines which of the gates 56 and 58 is to be enabled.

The output of the counter 44 is applied to a digital-to-analog converter 66 and to a 5-input NAND gate 68. The digital-to-analog converter 66 generates a gradually increasing and gradually decreasing amplitude switching waveform 70 for controlling an analog video switch 72.

The output of the NAND gate 68 is applied to an AND gate 74 together with the overflow output of the counter 44. The gate 74 serves to toggle the latch 24 and a latch 76 comprising a pair of gates 78 and 80 when the counter 44 overflows.

In operation, the horizontal clock 14 provides 512 pulses per horizontal scanning line to the horizontal counter 34. The pulses from the clock 14 are continuously counted by the horizontal counter 34 to provide a numerical indication of the horizontal position of the scanning beam. The position of the potentiometer 42 is sensed by the A-to-D converter 40 which applies a digital signal representative of the position of the potentiometer 42 to the lever counter 32. A vertical counter 36 counts the horizontal synchronizing pulses from the horizontal synchronizing source 20 to provide an indication of the number of the line being scanned. The contents of the lever counter 32, the horizontal counter 34 and the vertical counter 36 are compared by the comparator 38 which provides a transition signal to a NAND gate 82 when a predetermined combination of the counts in the horizontal and vertical counters 34 and 36 exceeds the value stored in the lever counter 32. This causes the output video signal to be switched in accordance with the position of the lever 42 and the horizontal and vertical position of the scanning beam.

The horizontal synchronizing circuit 20 provides a positive going horizontal synchronizing pulse at the beginning of each scanning line. The horizontal synchronizing pulse resets the counter 16 and the divide-by-255 circuit 22 to zero. The positive going synchronizing pulse is inverted by an inverter circuit 84 and applied to the NAND gate 26 to toggle the latch 24. The toggling of the latch 24 enables the gate 18 to apply pulses from the clock 14 to the counter 16.

The pulses from the clock 14 are counted by the horizontal counter 34. When the value of the count in the horizontal counter 34 reaches a sufficient magnitude to trigger one of the comparators 38, the output of the comparators 38 goes high, thereby causing the output of the gate 82 to go low and toggle the latch 76. Toggling the latch 76 enables the gate 54 to pass pulse from the voltage controlled oscillator 46 to the gates 56 and 58. The horizontal synchronizing pulse from the horizontal synchronizing circuit 20 is inverted by an inverter 86 and applied to the gate 62 of the latch 60 to cause the latch 60 to enable the gate 56 and disable the gate 58. As a result, the pulses from the voltage controlled oscillator 46 are routed to the up counting input of the counter 44 via the gates 54 and 56. The counter 44 continues to count the clock pulses until overflow.

As the count in the counter 44 increases, the output of the digital-to-analog converters 66 increases in a linear manner thereby gradually reducing the amount of signal passed between an input point 86 and an output point 90 of the video switch 72 while simultaneously increasing the amount of signal passed from an input point 88 to the output point 90. The rate at which the output point 90 is transferred from the input point 86 to the input point 88 is dependent upon the frequency of the voltage controlled oscillator 46. This frequency is adjusted by adjusting the potentiometer 48. A more rapid transition is provided when the frequency is increased, and a more gradual transition is provided when the frequency is decreased.

When the counter 44 overflows, a negative going carry signal is applied from the counter 44 to one input of the gate 74. All of the outputs of the counter 44 connected to the gate 68 are also high, and the gate 68 provides a low active state signal to the gate 74. This causes the output of the gate 74 to go low to toggle the latches 24 and 76. Both inputs to the gate 74 need not go low to provide a low state signal at the output of the gate 74, but a dual drive is used to assure that the latches 24 and 76 are toggled even if the carry signal from the counter 44 or the output from the gate 68 fails to go low. The gate 68 also permits the border count to be terminated prior to overflow, if desired, by connecting the inputs of the gate 68 to less significant bit outputs of the counter 44.

Toggling the latch 24 disables the gate 18, thereby freezing the count in the counter 16 to the value present at the end of the video transition. Toggling the latch 76 disables the gate 54 and freezes the count in the counter 44 to thereby maintain the counter 44 at full count. At this point, neither the counter 16 nor the counter 44 is counting and the value of the count stored in the counter 16 is representative of the end of the video transition. During this interval, however, the horizontal clock pulses are still being applied to the divide-by-255 circuit 22. After 255 pulses have been received, indicative of the center of a scan, the output of the divider 255 goes low thereby toggling the latches 24 and 60. Toggling the latch 24 reenables the gate 18, and the counter 16 resumes counting. Toggling the latch 60 disables the gate 56 and enables the gate 58 to permit pulses from the voltage controlled oscillator 46 to be applied to the down counting input 52 of the counter 44 when the gate 54 is subsequently enabled.

The counter 16 continues to count until it overflows and applies a low active state signal to the gate 80 of the latch 76 to thereby cause the latch 76 to reenable the gate 54. When the gate 54 is reenabled, the counter 44 counts in the reverse direction. The decreasing count is converted to a decreasing amplitude analog voltage by the digital-to-analog converter 66 and applied to the video switch 72. The video switch 72 responds to the decreasing analog voltage by gradually reducing the video signal transmitted from the input point 88 to the output 90 while simultaneously increasing the video signal transmitted from the input 86 in order to gradually switch the first video signal into the input 90. The video transition is completed when the count in the counter 44 is returned to zero.

The operation of the soft edge transition circuit and how it assures symmetry in a vignette-type insert will be better understood by referring to FIG. 2. The effect displayed in FIG. 2 is a diamond vignette insert 100 inserted in a background video area 102. The center of the screen is identified by a center line 104 and the transition border between the vignette 100 and the surrounding area is illustrated by a shaded area 106.

In order to explain the operation of the invention, the various switching operations that occur during one scanning line will be described. For purposes of discussion, the line being scanned will be identified by the numeral 108. As the scanning of the line 108 begins at a point 110 at the edge of the screen, the horizontal synchronizing circuit generates the horizontal synchronizing pulse that resets the logic and causes the end-of-transition counter 16 to begin counting. The line 108 is scanned from left to the right until the output of the comparator 38 causes the video transition to begin at point 112. At this point, the border counter 44 begins to count and the digital-to-analog converter 66 begins to generate the video switching waveform that gradually decreases the amplitude of the background video 102 and increases the amplitude of the background video 102 and increases the amplitude of the vignette video 100. The transition between the background video 102 and the vignette video 100 is completed at a point 114. At this point, the border counter 44 overflows and disables the operation of the end-of-transition counter 16.

As the scan proceeds from the point 114 to the intersection of the line 108 with the center line 104 at a point 116, neither the end-of-transition counter 16 nor the border counter 44 is operating. After the scan crosses the center line 104 at the point 116, the divide-by-255 divider 22 reenables the end-of-transition counter 16 which counts until it overflows at a point 118. The distance between the points 114 and 116 correspond to 255 counts less the number of counts between the initial point 110 and the end-of-transition point 114. This number is equal to the number of counts that can be applied to the counter 16 before it overflows. Consequently, when the count is resumed at the point 116, the distance scanned before the point 118 is reached will be equal to the distance between the points 114 and 116, thereby resulting in a symmetrical vignette about the center line 104. As can be seen by the dotted line 120, if the video transition were not begun until after the second video transition signal was generated by the comparator 38 (point 122) the vignette would be shifted to the right by an amount equal to the width of the border 106.

Between the points 118 and 122, the border counter 44 is counting in the reverse direction to cause the digital-to-analog converter 66 to provide a switching waveform to the video switch 72 for gradually increasing the amplitude of the surrounding video signal 102 and decreasing the amplitude of the vignette video 100. Following the point 122, no further switching is done until the horizontal synchronizing pulse at the beginning of the next scanning line reinitiates the same sequence.

In certain instances, a nonsymmetrical pattern may be desired. In such a case, the system may be inhibited by applying a low active state signal to an inhibit input point 92 of the gate 18. This disables the end-of-transition memory counter 16 causes the border generating circuit 12 to be controlled by the output of the comparator 38.

The output of the gate 80 in the latch circuit 76 is also applied to an output point 94. This provides an abrupt switching signal for controlling a second video switch (not shown) to provide a sharp transition in the video when a soft edge effect is not desired.

An alternative system for adjusting the width of the border is utilized in the embodiment of the invention illustrated in FIGS. 3 and 4. The circuit illustrated in FIGS. 3 and 4 shows a border width control circuit 150 (FIG. 4) disposed between a counter 244 (similar to the counter 44 in FIG. 1) and a digital-to-analog converter 266 similar to the digital-to-analog converter 66 of FIG. 1. The border width control circuit 150 utilizes a plurality of data selectors for selectively interconnecting a plurality of leads 152 from the counter 244 and a plurality of leads 154 connected to the digital-to-analog converter 266. By altering the interconnections between the leads 152 and 154, the value of count appearing at the leads 154 can be altered with respect to the count applied to the leads 152. The rearrangement of the interconnecting changes the apparent value of the count received by the digital-to-analog converter, and alters the slope of the switching waveform produced by the digital-to-analog converter. The altered slope of the switching waveform changes the rate at which the video switch is actuated, and results in a change in the width of the transition border.

The border control circuit 150 utilizes six data selectors 156, 158, 160, 162, 164 and 166 to variously interconnect the leads 152 and 154. Each of the data selectors has eight input and four output leads and employs four electronic switches each connected for selectively connecting one of two input leads to one of the output leads. A data selector suitable for the present application is a type 74157 data selector manufactured by Texas Instruments, Inc. The data selectors 156 and 158 are connected together as a divide-by-four digital divider. The division ratio of the data selectors 156 and 158 is controlled by a potential applied to a line 168 for selecting which of the inputs are to be connected to the outputs. For example, when a first potential, for example a binary zero, is applied to the line 168, the input line connected directly to the counter 244 are coupled to the output lines to connect the counter 244 to the data selectors 160 and 162 directly. When a second level potential is applied to the line 168, for example a binary one, the interconnections are altered such that the second stage of the counter 244 is connected to the second, third and fourth output leads from the data selector 156, and the first three output leads of the data selector 158 are connected to the third, fourth and fifth output leads, respectively, of the counter 244. Consequently, some of the binary digits from the counter 244 are offset to the right by two places. The two place offset results in an apparent four times multiplication of the value of the count, which in turn results in a more rapid change in the output voltage of the digital-to-analog converter and a border that is narrower by a factor of four. The reduced width border is useful when the transition circuit is operated in the hard transition mode.

In a similar fashion, the data selectors 160 and 162 offset the outputs of the data selectors 156 and 158 one place to provide a two-to-one reduction in the width of the border. The data selectors 164 and 166 select the outputs of the data selectors 156 and 158, or 164 and 166. The selection provides border reduction ratios of either four-to-one or one-to-one when the outputs of the data selectors 156 and 158 are selected, and two-to-one when the outputs of the data selectors 160 and 162 are selected. The data selectors 160, 162, 164 and 166 are controlled by the potential applied to a pair of lines 184 and 186, similar to the line 168.

The operation of the rest of the circuitry illustrated in FIGS. 3 and 4 is similar to that of the circuitry illustrated in FIG. 1. For the reason, analogous components in FIGS. 3 and 4 have been designated by 200's series numbers having tens and units digits corresponding to similar numbers in FIG. 1. For example, the counter 244 in FIG. 4 corresponds to counter 44 in FIG. 1. The circuit diagram of FIGS. 3 and 4 is more detailed than the diagram of FIG. 1 and shows the border counter 244 being fabricated from two 4-bit counters 243 and 245 connected in cascade. In the embodiment shown, the counters 243 and 245 are type 74193 up/down counters manufactured by Texas Instruments, Inc. The zero to 255 end-of-transition counter 216 (FIG. 3) is also fabricated from a pair of type 74193 counters.

A pair of 5-input NAND gates 174 and 176 are utilized alternately to enable a pair of gates 256 and 258 to cause the counter 244 to count in the up or in the down direction. As in the embodiment shown in FIG. 1, after the first transition, the counter initially counts in the up direction until all ones are applied to the gate 174. At this point, the gate 256 is disabled by the gate 174, and the count resumes in the downward direction the next time the gates 254 and 258 are enabled. The down count continues until the count in the counter 244 is reduced to zero. The zero count is inverted by four inverters 177 and applied to the gate 176 to thereby disable the gate 258 and terminate the down count when the zero count is reached.

A latch 276 comprising a pair of gates 278 and 280 receives the output signals from the gates 174 and 176 via a pair of gates 178 and 180 and a monostable multivibrator 182. The output of the gate 180 toggles the latch 276 temporarily to disable the gate 254 following the termination of each of up count and each down count.

In order to account for changes in the apparent count applied to the digital-to-analog converters caused by the data selectors, a bistable multivibrator fabricated from a pair of NAND gates 188 and 189 is used to enable both of the gates 174 and 176 when the potential on the data selector control line 186 is low regardless of the level of the potential on the one of the lines 154 connected to the gate 189. When the potential on the control line 186 is high, the multivibrator 187 toggles in response to the potential on line 154 connected to the gate 189 to enable the gate 174 when that potential corresponds to a one, and to enable the gate 176 when that potential corresponds to a zero. Consequently, the outputs of the gates 174 and 176 are dependent on the value of the least significant digit from counter 244 when that digit is selected by the data selectors, and independent of its value when it has not been selected.

The auxiliary circuitry for driving the soft transition system shown in FIGS. 3 and 4 is similar to that required to drive the circuit of FIG. 1. A horizontal clock 214 (FIG. 3) is utilized to drive the border counter 244 and the end-of-transition counter 216. The clock pulses are applied to the counter 244 via a monostable multivibrator 191 which serves to shape the clock pulses to render them compatible with the counter 244. The clock pulses are further shaped by a bistable multivibrator 192 and a monostable multivibrator 193 and applied to the end-of-transition counter 216. Both the end-of-transition counter 216 and a bistable multivibrator 192 are cleared at the initiation of each scanning line by pulses from the horizontal drive source 220 applied to the reset inputs thereof by a pair of inverting amplifiers 194 and 195.

The remaining inputs to the system are applied to a series of input points (FIG. 4), 302, 304 and 306 (FIG. 3). The input point 300 receives pulses indicative of the center of a scan from a source similar to the divider 22 of FIG. 1 or other source. Various transition signals from horizontal, vertical or other comparators, such as those contained in the comparator block 38 of (FIG. 1 are applied to the input points 302, 304 and 306. Three separate inputs are used to accommodate various polarity pulses which are selectively inverted by an inverter 308 and a pair of exclusive NOR gates 310 and 312 which serve as programmable inverters prior to being applied to a NAND gate 282. The NAND gate 282 serves to toggle the latch 276 to enable the gate 254 to thereby enable the border counter 244 to begin the border count after the transition signal has been received from the comparator. A gate 317 is interposed between the multivibrator 316 and the latch 276 to render the latch 276 responsive to transition signals from the comparator only during the initial half of each horizontal scan. A monostable multivibrator 314 synchronizes the transition signal applied to the latch 276 to the horizontal drive pulses from the source 220 and a second monostable multivibrator 316 is used to shape the pulse prior to application to the latch 276.

The signal applied to the input point 300 FIG. 4) is a step signal having a low level potential during the initial portion of the scan and a high level potential during the portion of the scan following the center. The signal applied to the input point 300 toggles a bistable multivibrator 320 that is synchronized to the horizontal clock 214. The bistable multivibrator 320 serves to apply a high level signal to the gate 256 to operate the border counter 244 in an up counting mode during the initial portion of the scan, and to enable the gate 258 to render the counter 244 operative in its down counting mode during the last half of the scan. The signal from the input point 300 is also applied to a monostable multivibrator 322 via a pair of gates 324 and 326. The multivibrator 322 responds to the transition in the signal applied to the point 300 by generating a low level pulse. The low level pulse is applied to the gate 226 in the latch 224 in order to toggle the latch 224 and enable the gate 218 to apply clock pulses to the counter 216. When the counter 216 overflows, a low level signal is applied to a NOR gate 325. Simultaneously, the low level output from the counter 216 is inverted by an amplifier 327 and applied to the T input of a JK flip-flop 328. The flip-flop 328 is cleared at the beginning of each scanning line by pulses from the horizontal drive source (applied thereto via multivibrators 314 and 316 and the gate 282), and provides an enabling pulse to the gate 325 upon receipt of the inverted signal received from the amplifier 327. This causes the gate 325 to apply a positive pulse to an inverting amplifier 330 which again toggles the latch 276. The latch 276 again enables the gate 254 which passes clock pulses through the now enabled gate 258 to cause the border counter 244 to count in the downward direction until all zeros are applied to the gate 176, thereby causing the gate 176 to again toggle the latch 276 and disable the gate 254 to terminate the count. This completes the transition back to the original video signal.

While certain preferred embodiments of the invention have been described by way of illustration, many modifications will occur to those skilled in the art; it will be understood, of course, that it is not desired that the invention be limited thereto, since modifications may be made, and it is, therefore, contemplated by the appended claims to cover any such modifications as fall within the true scope and spirit of the invention.

What is claimed as new and desired to be secured by Letters Patent of the United States is:

1. A soft edge transition system for use with a special effects generator providing transition signals for rendering said transition circuit operative to switch one of first and second video input signals into a video output signal under the control of synchronizing signals, said transition circuit comprising:
   means responsive to said transition signal for gradually switching said fist video input signal out of said video output signal and switching said second video input signal into said video output signal;
   means responsive to said synchronizing signals and said switching means for determining the time interval between a predetermined datum and the completion of the gradual switching by said switching means;
   means for generating an intermediate point signal representative of a predetermined point in the interval between synchronizing signals; and
   means operatively coupled to said switching means and responsive to said intermediate point signal generating means and said time interval determining means for rendering said switching means operative gradually to switch said second video input signal out of said video output signal and said first video input signal into said video output signal.

2. A soft edge transition system as recited in claim 1 wherein said predetermined datum is the most recent synchronizing signal.

3. A soft edge transition system as recited in claim 2 wherein said time interval determining means includes means for determining said time interval digitally.

4. A soft edge transition system as recited in claim 3 wherein said switching means includes means for digitally controlling the switching of said video signals.

5. A soft edge transition system as recited in claim 4 wherein said digital controlling means includes means for generating a series of digital representations and means responsive to said digital representations for generating a video switching signal having a gradual transition between first and second states.

6. A soft edge transition system as recited in claim 5 wherein said digital representation generating means includes a source of periodic signals and means for counting said periodic signals.

7. A soft edge transition system as recited in claim 6 further including means for rendering said video switching signal generating means operative to alter the rate of change of said gradual transition.

8. A soft edge transition system as recited in claim 7 wherein said counting means has a plurality of outputs and said video switching signal generating means has a plurality of inputs, wherein said transition rate altering means includes means for selectively interconnecting various ones of the outputs of said counting means and the inputs of said video switching signal generating means.

9. A soft edge transition system as recited in claim 7 wherein said gradual transition rate altering means includes means for changing the frequency of said periodic signals.

10. A soft edge transition system as recited in claim 9 wherein said selective interconnecting means includes a digital data selector.

11. A soft edge transition system as recited in claim 3 wherein said digital time interval determining means includes a source of periodic signals and means for counting said periodic signals, said counting means including means responsive to each of said synchronizing signals for initiating the counting of said periodic signals and means responsive to said gradual switching means for suspending the counting of said periodic signals upon the completion of the gradual switching.

12. A soft edge transition system as recited in claim 11 wherein said intermediate point signal generating means includes means for counting said periodic signals and providing said midpoint representative signal upon receipt of a predetermined number of periodic signals corresponding to said predetermined point.

13. A soft edge transition system as recited in claim 12 wherein said counting means includes a zero-to-255 counter and means for resetting said counter upon receipt of one of said synchronizing signals.

14. A soft edge transition system as recited in claim 11 wherein said counting means includes means for providing an output upon receipt by said counting means of a predetermined number of periodic signals representative of the interval between said predetermined intermediate point and the synchronizing signal immediately preceeding said intermediate point.

15. A soft edge transition system as recited in claim 14 further including means operatively coupling said intermediate point signal generating means and said counting means for reinitiating the counting of said periodic pulses upon the receipt of said intermediate point representative signal.

16. A soft edge transition system as recited in claim 15 further including means operatively coupling said switching means and said counting means for rendering said switching means operative gradually to switch said second video input signal out of said video output signal and said first video signal into said video output signal in response to said output from said counting means.

17. A soft edge transition system as recited in claim 16 wherein said predetermined intermediate point is the midpoint of a horizontal scan.

18. A soft edge transition system as recited in claim 17 wherein said counting means includes a zero-to-255 counter.

19. A soft edge transition system as recited in claim 18 wherein said zero-to-255 counter includes an overflow output point for providing said output representative of the receipt of said predetermined number of periodic signals corresponding to the interval between said midpoint and the synchronizing signal immediately preceding said midpoint.

20. The method for providing a symmetrical soft edge video special effect comprising the steps of:
    initiating a first gradual transition between first and second video signals;
    generating an indication of the location on a video image of the completion of the transition;
    generating an indication of the location of a datum on the video image; and
    initiating a second gradual transition back to said first video signal at a predetermined location on the video image such that the initiation of said second gradual transition and the termination of said first gradual transition are symmetrically disposed about said datum.

21. The method recited in claim 20 wherein the step of generating the indication of the completion of the first transition includes the steps of initiating a scan and to determining the time interval between the initiation of the scan and the completion of the first transition.

22. The method recited in claim 21 wherein the step of generating the location of the datum includes the step of determining the center of the scan.

23. The method recited in claim 22 wherein the step of determining the center of the scan includes the steps of determining the time duration of the scan and generating a center indication subsequent to the initiation of the scan, the time interval between the scan initiation and the center indication being substantially equal to one half of the time duration of the scan.

24. The method recited in claim 23 wherein the step of initiating the second gradual transition includes the step of initiating the transition after a predetermined time interval has elapsed following the generation of the center indication, the predetermined time interval being substantially equal to the difference between one half of the time duration of the scan and the time interval between initiation of the scan and the completion of the first gradual transition.

* * * * *